(12) United States Patent
Eto et al.

(10) Patent No.: US 9,111,969 B2
(45) Date of Patent: Aug. 18, 2015

(54) SEAL MEMBER, ETCHING APPARATUS, AND A METHOD OF MANUFACTURING A SEMICONDUCTOR DEVICE

(71) Applicant: KABUSHIKI KAISHA TOSHIBA, Minato-ku, Tokyo (JP)

(72) Inventors: Hideo Eto, Mie (JP); Makoto Saito, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/761,359

(22) Filed: Feb. 7, 2013

(65) Prior Publication Data
US 2013/0330929 A1 Dec. 12, 2013

(30) Foreign Application Priority Data
Jun. 8, 2012 (JP) .................................. 2012-130999

(51) Int. Cl.
H01L 21/00 (2006.01)
H01L 21/67 (2006.01)
H01L 21/3065 (2006.01)
F16J 15/12 (2006.01)
H01J 37/32 (2006.01)

(52) U.S. Cl.
CPC ......... H01L 21/67069 (2013.01); F16J 15/122 (2013.01); H01J 37/32091 (2013.01); H01J 37/32532 (2013.01); H01L 21/3065 (2013.01)

(58) Field of Classification Search
CPC ............... F16J 16/122; H01J 37/32513; H01J 37/32532
USPC ............ 118/723 E, 715; 156/345.43, 345.44, 156/345.45, 345.46, 345.47
See application file for complete search history.

(56) References Cited

U.S. PATENT DOCUMENTS

| | | | |
|---|---|---|---|
| 5,425,832 A * | 6/1995 | Kusano et al. ............. 156/272.6 |
| 6,073,577 A | 6/2000 | Lilleland et al. |
| 6,148,765 A | 11/2000 | Lilleland et al. |
| 6,194,322 B1 | 2/2001 | Lilleland et al. |
| 6,376,385 B2 | 4/2002 | Lilleland et al. |
| 6,491,784 B2 * | 12/2002 | Yamaguchi et al. ..... 156/345.34 |
| 8,147,648 B2 | 4/2012 | Dhindsa |
| 8,187,413 B2 | 5/2012 | Patrick et al. |

(Continued)

FOREIGN PATENT DOCUMENTS

| | | |
|---|---|---|
| JP | 2002-519862 A | 7/2002 |
| JP | 2009-049194 A | 3/2009 |

(Continued)

OTHER PUBLICATIONS

Office Action mailed Apr. 21, 2015 in the corresponding JP Application No. 2012-130999 (and English translation). X.

Primary Examiner — Sylvia R MacArthur
Assistant Examiner — Anna Crowell
(74) Attorney, Agent, or Firm — Posz Law Group, PLC

(57) ABSTRACT

Provided is a seal member according to embodiments. The seal member is disposed between an upper electrode and a backing plate in an etching apparatus to seal a gap between the upper electrode and the backing plate. In addition, the seal member is configured to include a high heat conductivity member having a heat conductivity higher than that of a first member formed by using siloxane bond and a low resistance member having a resistivity lower than that of the first member.

12 Claims, 7 Drawing Sheets

(56) References Cited

U.S. PATENT DOCUMENTS

| | | |
|---|---|---|
| 2007/0075503 A1* | 4/2007 | Hayashi et al. ............... 277/589 |
| 2008/0308229 A1* | 12/2008 | Patrick et al. ............ 156/345.34 |
| 2009/0200269 A1 | 8/2009 | Kadkhodayan et al. |
| 2009/0277585 A1* | 11/2009 | Maebashi et al. ........ 156/345.28 |
| 2009/0305509 A1* | 12/2009 | Stevenson et al. ............ 438/710 |
| 2010/0184298 A1* | 7/2010 | Dhindsa ....................... 438/710 |
| 2011/0232843 A1* | 9/2011 | Bowman et al. ........... 156/345.1 |
| 2011/0247759 A1 | 10/2011 | Kitajima et al. |
| 2012/0171871 A1 | 7/2012 | Dhindsa |

FOREIGN PATENT DOCUMENTS

| | | |
|---|---|---|
| JP | 2011-511475 A | 4/2011 |
| JP | 2011-517834 A | 6/2011 |
| JP | 2011-523229 A | 8/2011 |
| JP | 2011-181677 A | 9/2011 |
| JP | 2012-500471 A | 1/2012 |
| WO | 03/087221 A2 | 10/2003 |

* cited by examiner

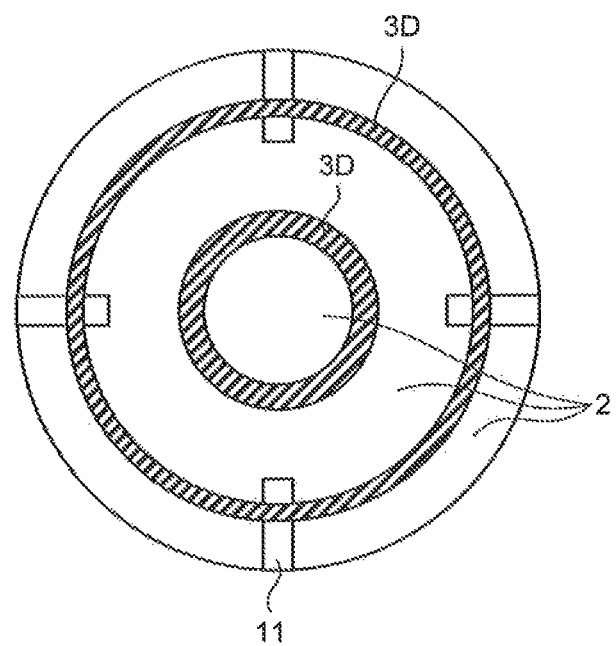
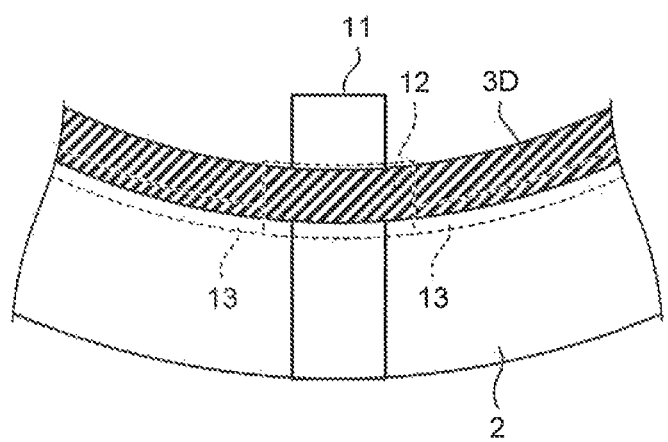

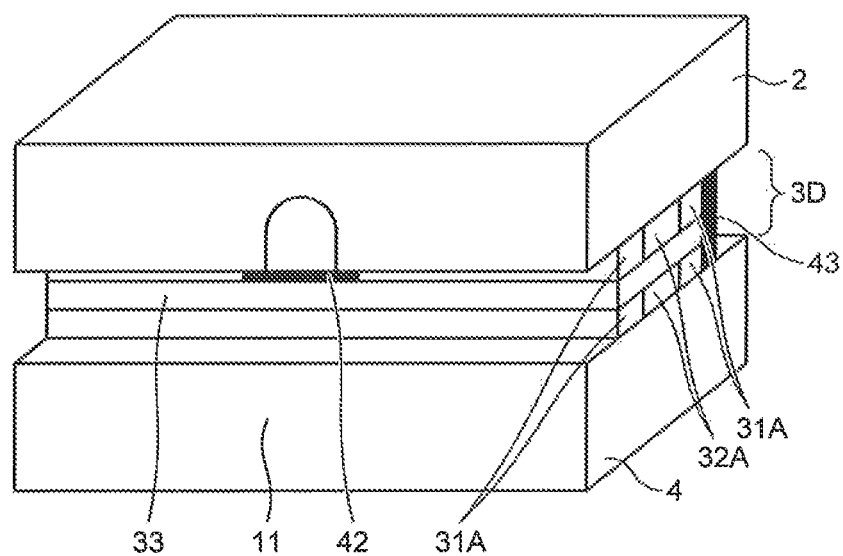

SEAL MEMBER, ETCHING APPARATUS, AND A METHOD OF MANUFACTURING A SEMICONDUCTOR DEVICE

CROSS-REFERENCE TO RELATED APPLICATIONS

This application is based upon and claims the benefit of priority from Japanese Patent Application No. 2012-130999, filed on Jun. 8, 2012; the entire contents of which are incorporated herein by reference.

FIELD

Embodiments described herein relate generally to a seal member, an etching apparatus, and a method of manufacturing a semiconductor device.

BACKGROUND

As an apparatus used for manufacturing a semiconductor device, there is an etching apparatus which etches various films on a substrate. For example, an RIE (Reactive Ion Etching) apparatus generates plasma of an etching gas by applying electromagnetic wave or the like to the etching gas in a reaction chamber and applies a radio frequency voltage between an upper electrode and a lower electrode, Accordingly, ions or radicals in the plasma are allowed to collide with the substrate, so that various films on the substrate are etched.

In such an RIE apparatus, a siloxane-based seal member (Q-PAD and the like) having a heat conductivity and an electric conductivity is used between a backing plate and a Si (silicon) electrode.

However, if siloxane is used for the seal member, the seal member has almost no plasma resistance, so that its lifecycle is short, and the seal member may cause a problem in electric contact points. Therefore, a seal member which has high plasma resistance and does not cause a problem in electric contact points is required.

BRIEF DESCRIPTION OF THE DRAWINGS

FIGS. 5A and 5B are diagrams illustrating a position of a clamp groove and a corroded position; and FIG. 6 is a diagram illustrating a configuration of a seal member according to a second embodiment.

DETAILED DESCRIPTION

According to embodiments, a seal member is provided. The seal member is disposed between an upper electrode and a backing plate in an etching apparatus to seal a gap between the upper electrode and the backing plate. In addition, the seal member is configured to include a high heat conductivity member having a heat conductivity higher than that of a first member formed by using siloxane bond and a low resistance member having a resistivity lower than that of the first member.

Hereinafter, a seal member, an etching apparatus, and a method of manufacturing a semiconductor device according to embodiments will be described in detail with reference to attached drawings. In addition, the present invention is not limited to the embodiments.

(First Embodiment)

Figure 1:
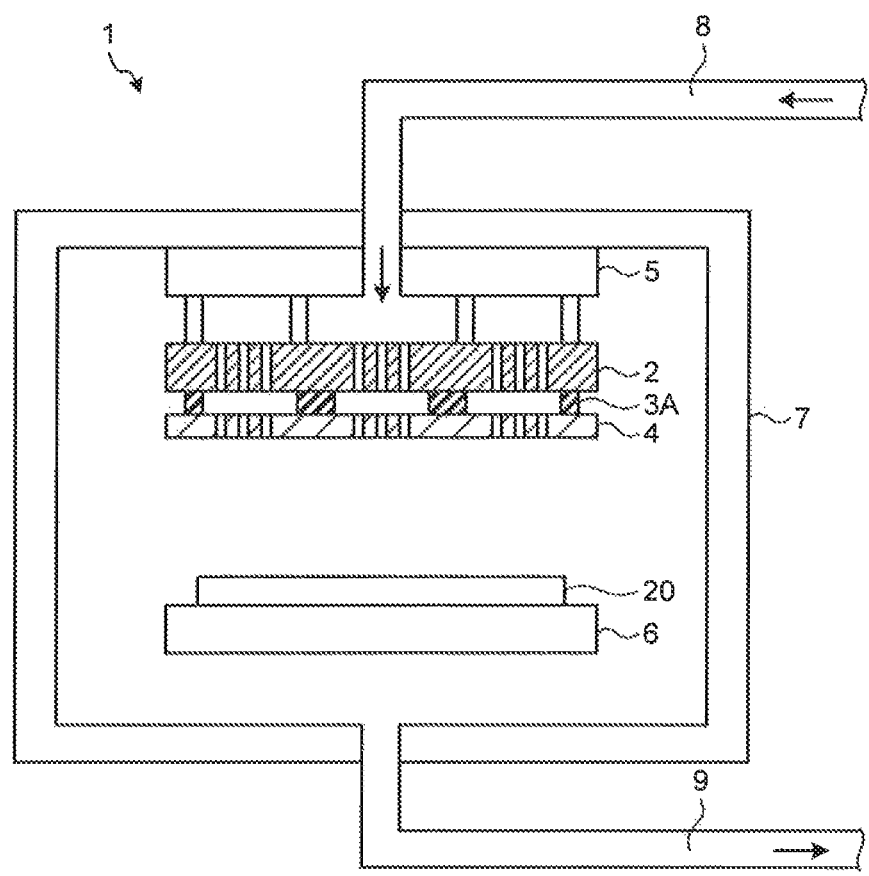
FIG. 1 is a cross-sectional view illustrating a schematic configuration of an etching apparatus according to a first embodiment.

FIG. 1 is a cross-sectional view illustrating a schematic configuration of an etching apparatus according to a first embodiment. The etching apparatus 1 is an RIE (Reactive Ion Etching) apparatus or the like which performs dry etching and is used, for example, for manufacturing a semiconductor device.

The etching apparatus 1 is configured to include a top plate 5, a backing plate 2, a seal member 3A, a Si (silicon) electrode 4 that is an upper electrode, a lower electrode 6, a chamber 7, a gas pipe 8, and a gas pipe 9.

The top plate 5, the backing plate 2, the silicon electrode 4, and the lower electrode 6 are configured by using substantially disc-shaped members, and the seal member 3A is configured by using a substantially ring-shaped member.

The top plate 5 is configured by using an Al (aluminum) member or the like and is disposed at an upper side in the chamber 7. The backing plate 2 is disposed at a bottom surface side of the top plate 5. The backing plate 2 is configured to fix and support the silicon electrode 4. A plurality of gas holes which direct from the upper surface to the bottom surface are installed in the backing plate 2.

The seal member 3A is a Q-PAD or the like which seals the gap between the backing plate 2 and the silicon electrode 4. The seal member 3A is disposed between the backing plate 2 and the silicon electrode 4 to connect the backing plate 2 and the silicon electrode 4. In the embodiment, the seal member 3A is configured by using plural kinds of members which have no siloxane bond (siloxane-based). The seal member 3A is formed by using, for example, a low resistance member, a high heat conductivity member, and an aluminum thin film.

The silicon electrode 4 is disposed at the bottom surface side of the backing plate 2 through the seal member 3A. The lower electrode 6 is disposed through a predetermined distance with respect to the silicon electrode 4 so as to face the silicon electrode 4. A plurality of gas holes which direct from the upper surface to the bottom surface are installed in the lower electrode 6. A substrate 20 as a to-be-processed product such as a wafer is mounted on the lower electrode 6.

The chamber 7 (inside of the reaction chamber) is connected to the gas pipe 8 and the gas pipe 9. In the chamber 7, an etching gas is transported from the gas pipe 8, and a remaining gas is exhausted from the gas pipe 9. The top plate 5, the backing plate 2, the seal member 3A, the silicon electrode 4, and the lower electrode 6 are disposed in the chamber 7.

When various films or patterns on the substrate 20 are to be etched, the etching apparatus 1 introduces the etching as into the chamber 7 and generates plasma of the etching gas by applying a radio frequency voltage between the silicon electrode 4 and the lower electrode 6. Since a self bias voltage occurs between the plasma and the lower electrode 6, ions or radicals in the plasma are accelerated, toward the substrate 20 to collide with the substrate 20. As a result, only the portion of the substrate 20 which collides with the ions or radicals is etched through a chemical reaction, so that films or pattern on the substrate 20 are etched.

Figure 2:
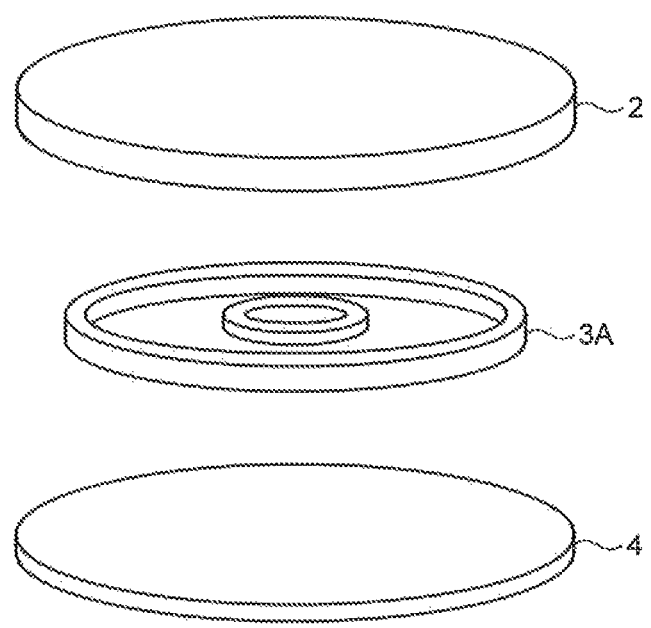
FIG. 2 is a diagram illustrating a shape of a seal member according to the first embodiment.

FIG. 2 is a diagram illustrating a shape of the seal member according to the first embodiment. FIG. 2 illustrates the backing plate 2, the seal member 3A, and the silicon electrode 4 before assembly. In addition, in FIG. 2, the gas holes of the backing plate 2 and the gas holes of the silicon electrode 4 are not illustrated, The seal member 3A is a substantially ring-shaped member, and one or a plurality of the seal members 3A are disposed between the backing plate 2 and the silicon electrode 4. The seal member 3A is interposed between the bottom surface of the backing plate 2 and the upper surface of the silicon electrode 4. Each of the seal members 3A has a ring-shaped principal plane, and in the case where a plurality of the seal members 3A are disposed, the ring-shaped principal planes are disposed in a concentric shape. The centers of the seal members 3A which are ring-shaped members, the backing plate 2, and the silicon electrode 4 are aligned in the same axis, and the principal planes are disposed to be parallel to each other.

Figure 3A:
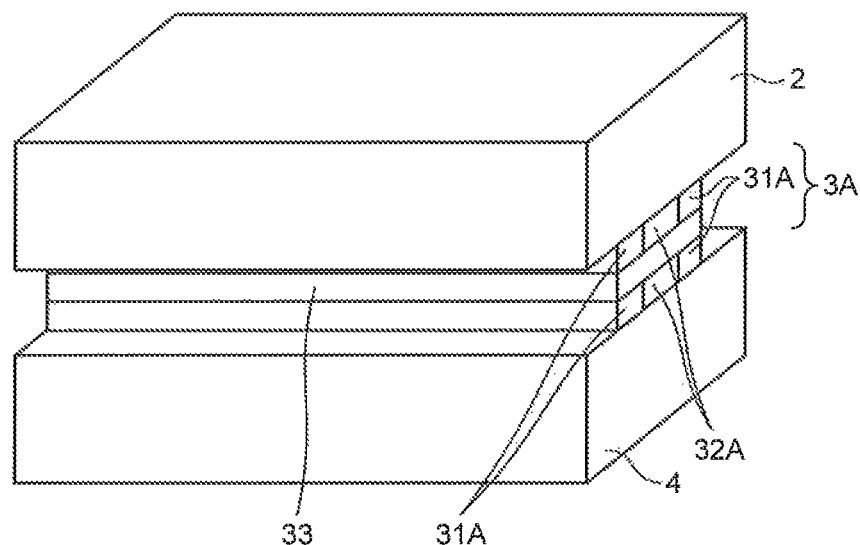
FIGS. 3A to 3D are diagrams illustrating a configuration of the seal member according to the first embodiment.
Figure 3B:
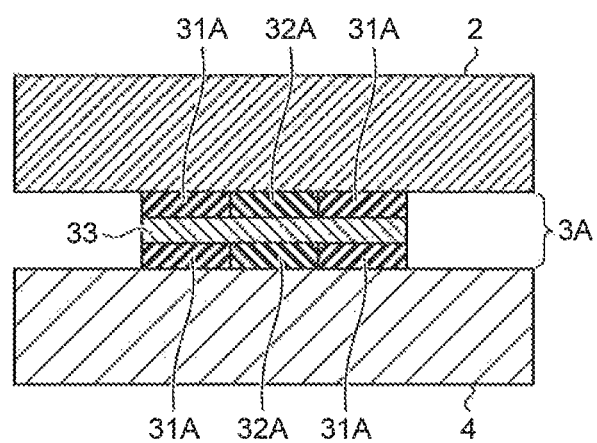
Figure 3C:
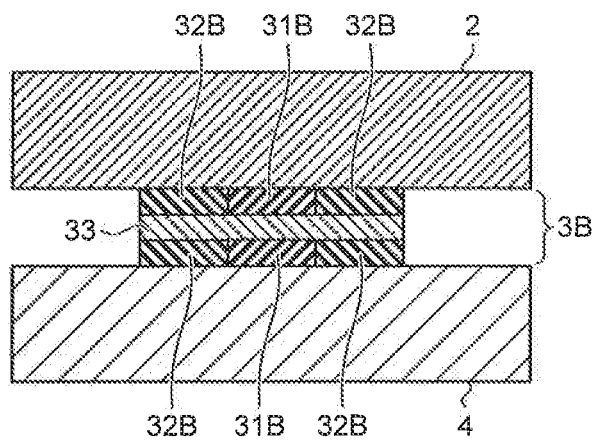
Figure 3D:
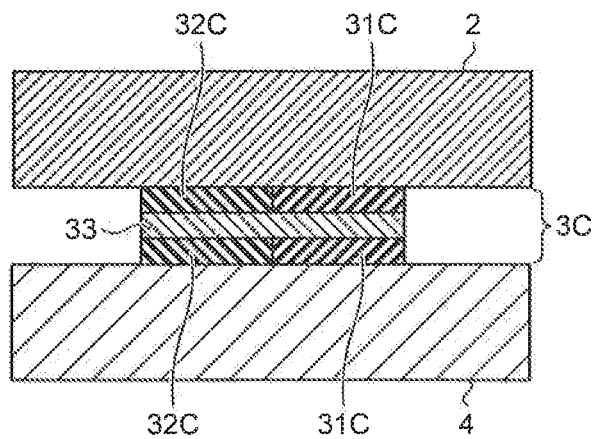

FIGS. 3A to 3D are diagrams illustrating a configuration of the seal member according to the first embodiment. FIG. 3A is a perspective view illustrating the seal member 3A, and FIG. 3D is a cross-sectional view illustrating the seal member 3A. The seal member 3A is configured to include a high heat conductivity member 31A, a low resistance member 32A, and an aluminum thin film 33.

The high heat conductivity member 31A disposed at the ring-shaped outer circumference side, the high heat conductivity member 31A disposed at the ring-shaped inner circumference side, and the low resistance member 32A interposed between the high heat conductivity members 31A are disposed in the first layer of the seal member 3A. In addition, the members having the same configurations as those of the first layer of the seal member 3A are disposed. in the third layer of the seal member 3A. In addition, the aluminum thin film (film layer) 33 is disposed in the second layer of the seal member 3A.

In addition, the first layer is disposed on the upper surface of the silicon electrode 4, the second layer is disposed on the upper surface of the first layer, the third layer is disposed on the upper surface of the second layer, and the backing plate 2 is disposed on the upper surface of the third layer.

The high heat conductivity member 31A is a member having a heat conductivity higher than that of Q-PAD which is formed by using siloxane bond, and the low resistance member 32A is a member having a resistivity lower than that of the Q-PAD which is formed by using siloxane bond.

The high heat conductivity member 31A is a member except for siloxane and is, for example, an acrylic rubber. The member used for the high heat conductivity member 31A has a heat conductivity of, for example, 3 W/m·K or more. In addition, the member used for the high heat. conductivity member 31A has characteristics of, for example, about 60 to 90 in hardness and about $6 \times 10^9$ Ω·cm in resistivity. In addition, the member used for the high heat conductivity member 31A may have a heat conductivity of 2.5 W/m·K or more.

In addition, the low resistance member 32A is a member except for siloxane and is, for example, an NBR rubber. The member used for the low resistance member 32A has a resistivity of, for example, $1.2 \times 10^2$ Ω·cm or less. In addition, the member used for the low resistance member 32A has a characteristic of, for example, about 60 to 90 in hardness. In addition, the member used for the low resistance member 32A may have a resistivity of $1.0 \times 10^4$ Ω·cm or less.

In addition, the configuration of the seal member 3A is not limited to the configuration illustrated in FIG. 3A or 3B. FIG. 3C is a cross-sectional view illustrating another Configuration Example 1 (seal member 3B) of the seal member 3A, and FIG. 3D is a cross-sectional view illustrating still another Configuration Example 2 (seal member 3C) of the seal member 3A.

As illustrated in FIG. 3C, the seal member 3B may be configured by exchanging the disposed position of the high heat conductivity member 31A and the disposed position of the low resistance member 32A in the seal member 3A illustrated in FIG. 3B. In this case, a low resistance member 32B disposed at the ring-shaped outer circumference side, a low resistance member 32B disposed at the ring-shaped inner circumference side, and a high heat conductivity member 31B interposed between the low resistance members 32B are disposed in the first layer of the seal member 3B. In addition, the members having the same configurations as those of the first layer of the seal member 3A are disposed in the third layer of the seal member 3B. In addition, the aluminum thin film 33 is disposed in the second layer of the seal member 3B.

In addition, as illustrated in FIG. 3D, the seal member 3C may be configured to include one high heat conductivity member 31C and one low resistance member 32C. In this case, a low resistance member 32C disposed at the ring-shaped outer circumference side and a high heat conductivity member 31C disposed at the ring-shaped inner circumference side are disposed in the first layer of the seal member 3C. In addition, the members having the same configurations as those of the first layer of the seal member 3C are disposed in the third layer of the seal member 3C. In addition, the aluminum thin film 33 is disposed in the second layer of the seal member 3C.

In addition, the seal member 3C may be configured by exchanging the disposed position of the high heat conductivity member 31C and the disposed position of the low resistance member 32C in the seal member 3C illustrated in FIG. 3D. In this case, a high heat conductivity member 31C disposed at the ring-shaped outer circumference side and a low resistance member 32C disposed at the ring-shaped inner circumference side are disposed in the first layer of the seal member 3C.

In addition, shapes and volumes of the high heat conductivity members 31A to 31C or the low resistance members 32A to 32C are set based on desired heat conductivities and resistivities of the seal members 3A to 3C. For example, in the case where high heat conductivities are required for the seal members 3A to 3C, the seal members 3A to 3C are formed so that the volumes of the high heat conductivity members 31A to 31C are increased. In addition, in the case where low resistance is required for the seal members 3A to 3C, the seal members 3A to 3C are formed so that the volumes of the high heat conductivity members 31A to 31C are decreased and the volumes of the low resistance members 32A to 32C are increased.

In this manner, since the seal members 3A to 3C are configured to include the high heat conductivity members 31A to 31C and the low resistance members 32A to 32C by using the members except for siloxane, it is possible to prevent a problem in electric contact points in the etching apparatus 1.

Figure 4:
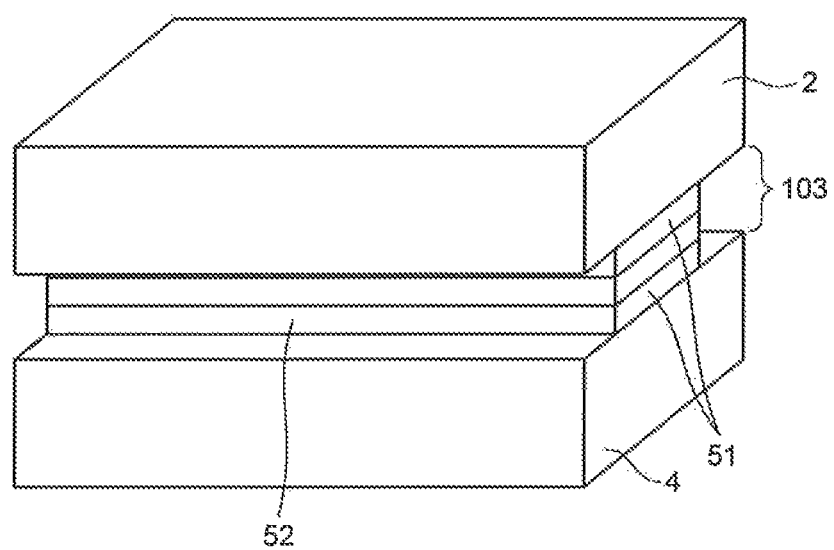
FIG. 4 is a diagram illustrating a configuration of a seal member in the case where siloxane is used.

FIG. 4 is a diagram illustrating a configuration of a seal member in the case where siloxane is used. FIG. 4 is a cross-sectional view illustrating a seal member 103 in the case where siloxane is used for the seal member 103. In the case where siloxane is used for the seal member 103, for example, a polysiloxane 51 is disposed in the first and third layers of the seal member 103. In addition, an aluminum thin film 52 is disposed in the second layer of the seal member 103.

In addition, the polysiloxane 51 that is the first layer is disposed on the upper surface of the silicon electrode 4, the aluminum thin film 52 that is the second layer is disposed on the upper surface of the first layer, the polysiloxane 51 that is the third layer is disposed on the upper surface of the second layer, and the backing plate 2 is disposed on the upper surface of the third layer.

The problem in electric contact points is defective contact occurring in the vicinity of an electric contact point in the etching apparatus or the like. If cyclic dimethylpolysiloxane and the like are volatilized from the seal member 103, cyclic dimethylpolysiloxane is changed into an insulating material by electric flame, so that a problem in electric contact points occurs. As a problem in electric contact points, for example, there is defective contact in a relay or a switch, stoppage in rotation of a micro-motor, or the like.

During the manufacturing of a semiconductor device (semiconductor integrated circuit), substrate processes are performed by using various semiconductor manufacturing apparatuses. More specifically, a film formation apparatus forms films on the substrate 20, and after that, a resist application apparatus applies resist on the substrate 20. Next, an exposure apparatus performs exposure on the substrate 20 by using a mask. Next, a development apparatus develops the substrate 20 to form a resist pattern on the substrate 20. Next, the etching apparatus 1 etches a lower layer side of the substrate 20 by using the resist pattern as a mask. Accordingly, an actual pattern corresponding to the resist pattern is formed on the substrate 20. During the manufacturing of the semiconductor device, the film formation process, the resist application process, the exposure process, the development process, the etching process, and the like are repetitively performed on each layer.

In addition, in the embodiment, although the example where the seal member 3A is configured by using the high heat conductivity member 31A and the low resistance member 32A is described, in the case where a member having both characteristics of a high heat conductivity and low resistance is used, members are disposed at the positions illustrated in FIG. 4.

In addition, in the embodiment, although the example where the first or third layer of the seal member 3A are configured by using three members of the high heat conductivity member 31A, the low resistance member 32A, and the high heat conductivity member 31A, the first or third layer of the seal member 3A may be configured by using four or more members. In other words, the first or third layer of the seal member 3A may be configured by using the two high heat conductivity members 31A and the two low resistance members 32A. In this case, in the first or third layer of the seal member 3A, the high heat conductivity member 31A and the low resistance member 32A are alternately disposed.

In this manner, according to the first embodiment, since the seal member 3A is configured to include the high heat conductivity member 31A and the low resistance member 32A by using the members except for siloxane, it is possible to prevent a problem in electric contact points in the etching apparatus 1 by using the seal member 3A having a simple, easy configuration.

(Second Embodiment)

Next, a second embodiment will be described with reference to FIGS. 5A and 5B and FIG. 6. In the second embodiment, a corrosion-resistance member which prevents corrosion from occurring in the vicinity or the like of the outer circumference portion of a seal member is disposed in the seal member.

FIGS. 5A and 5B are diagrams illustrating a position of a clamp groove and a corroded position. FIGS. 5A and 5B are top diagrams illustrating a backing plate 2 and a seal member 3D as seen from a bottom surface side (side facing a silicon electrode 4) of the backing plate 2.

As illustrated in FIG. 5A, clamp grooves 11 are installed in the outer circumference portion of the backing plate 2. In addition, the seal member 3D and the backing plates 2 are adhered with each other so that portions of the seal member 3D overlap the clamp grooves 11.

As illustrated in FIG. 5B, a contact area 12 where the seal member 3D and the clamp groove 11 are in contact with each other and an outer circumference portion area 13 which is an area in the vicinity of the outer circumference portion among the seal member 3D disposed at the outermost circumference are areas of the seal member 3D which can be easily corroded, Therefore, in the embodiment, the easily corrosive area is coated with a corrosion-resistance member (for example, a fluorine based rubber or the like), so that the corrosion of the seal member 3D is prevented.

FIG. 6 is a diagram illustrating a configuration of the seal member according to the second embodiment. FIG. 6 is a perspective diagram illustrating the seal member 3D disposed at the outermost circumference as seen from the inner circumference side. In addition, the components of FIG. 6 having the same functions as those of the seal member 3A according to the first embodiment illustrated in FIG. 3A are denoted by the same reference numerals, and redundant description thereof is not repeated.

The seal member 3D which is disposed in the outermost circumference is configured to include a high heat conductivity member 31A, a low resistance member 32A, an aluminum thin film 33, and corrosion-resistance members 42 and 43. In other words, the seal member 3D disposed at the outermost circumference is configured by adding the corrosion-resistance members 42 and 43 to the seal member 3A.

In the contact area 12, when the seal member 3D is allowed to be in contact with the backing plate 2, the corrosion-resistance member 42 is disposed so that the corrosion-resistance member 42 is in contact with the clamp groove 11. In addition, the corrosion-resistance member 43 is disposed in the outer circumference portion area 13 (ring-shaped outermost circumference area) of the outermost circumference portion of the seal member 3D disposed at the outermost circumference. In this manner, in the embodiment, the corrosion-resistance member 42 is disposed in the contact area 12, and the corrosion-resistance member 43 is disposed in the outer circumference portion area 13. In addition, the areas of the seal member 3D except for the corrosion-resistance members 42 and 43 may have the same configurations as those of the seal members 3E, 3C, and 103.

In this manner, according to the second embodiment, since the seal member 3D is configured so that the corrosion-resistance member 42 is disposed in the contact area 12 where the seal member 3D is easily corroded and the corrosion-resistance member 43 is disposed in the outer circumference portion area 13 where the seal member is easily corroded, it is possible to prevent corrosion of the seal member 3D by using the seal member 3D having a simple, easy configuration.

In this manner, according to the first and second embodiments, it is possible to prevent a problem in electric contact points in the etching apparatus 1 by using the seal members 3A to 3D having simple, easy configurations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A seal member disposed between an upper electrode and a backing plate in an etching apparatus to seal a gap between the upper electrode and the backing plate, the seal member comprising:
 a high heat conductivity member having a higher heat conductivity than a heat conductivity of siloxane; and
 a low resistance member having a lower resistivity than a resistivity of siloxane,
 wherein, disposed between the upper electrode and the backing plate is:
  a first layer in which the high heat conductivity member and the low resistance member are arranged on a first plane, the first plane being parallel to an upper surface of the upper electrode;
  a second layer in which the high heat conductivity member and the low resistance member are arranged. on a second plane, the second plane being parallel to the upper surface of the upper electrode; and
  an aluminum thin film layer interposed between the first layer and the second layer.

2. The seal member according to claim 1, wherein the high heat conductivity member and the low resistance member have ring-shaped principal planes which are disposed in a concentric shape.

3. The seal member according to claim 2, further comprising a first corrosion-resistance member,
 wherein the first corrosion-resistance member is disposed in the ring-shaped outermost circumference area.

4. The seal member according to claim 1, further comprising a second corrosion-resistance member,
 wherein the second corrosion-resistance member is disposed in an area which is in contact with a clamp groove installed in the backing plate.

5. The seal member according to claim 1, wherein the high heat conductivity member has a heat conductivity of 3 W/m·K or more.

6. The seal member according to claim 1, wherein the low resistance member has a resistivity of $1.2 \times 10^2$ Ω·cm or less.

7. An etching apparatus comprising:
 an upper electrode and a lower electrode where a radio frequency voltage is applied between the electrodes;
 a backing plate which fixes and supports the upper electrode; and
 a seal member which is disposed between the upper electrode and the backing plate to seal a gap between the upper electrode and the backing plate,
 wherein the seal member includes
  a high heat conductivity member having a higher heat conductivity than a heat conductivity of siloxane; and
  a low resistance member having a lower resistivity than a resistivity of siloxane,
 wherein, disposed between the upper electrode and the backing plate are:
  a first layer in which the high heat conductivity member and the low resistance member are arranged on a first plane, the first plane being parallel to an upper surface of the upper electrode;
  a second layer in which the high heat conductivity member and the low resistance member are arranged on a second plane, the second plane being parallel to the upper surface of the upper electrode; and
  an aluminum thin film layer interposed between the first layer and the second layer are disposed between the upper electrode and the backing plate.

8. The etching apparatus according to claim 7, wherein the high heat conductivity member and the low resistance member have ring-shaped principal planes which are disposed in a concentric shape.

9. The etching apparatus according to claim 8, further comprising a first corrosion-resistance member,
 wherein the first corrosion-resistance member is disposed in the ring-shaped outermost circumference area.

10. The etching apparatus according to claim 7, further comprising a second corrosion-resistance member,
 wherein the second corrosion-resistance member is disposed in an area which is in contact with a clamp groove installed in the backing plate.

11. The etching apparatus according to claim 7, wherein the high heat conductivity member has a heat conductivity of 3 W/m·K or more.

12. The etching apparatus according to claim 7, wherein the low resistance member has a resistivity of $1.2 \times 10^2$ Ω·cm or less.

* * * * *